United States Patent
Rajski et al.

(10) Patent No.: US 6,966,021 B2
(45) Date of Patent: Nov. 15, 2005

(54) METHOD AND APPARATUS FOR AT-SPEED TESTING OF DIGITAL CIRCUITS

(76) Inventors: Janusz Rajski, 6502 Horton Rd., West Linn, OR (US) 97068; Abu Hassan, 3585 Sandpebble Dr. #600, San Jose, CA (US) 95136; Robert Thompson, 9270 SW. Stone Dr., Tualatin, OR (US) 97062; Nagesh Tamarapalli, 29290 SW. Parkway Ct. #93, Wilsonville, OR (US) 97070

( * ) Notice: Subject to any disclaimer, the term of this patent is extended or adjusted under 35 U.S.C. 154(b) by 74 days.

(21) Appl. No.: 10/301,127

(22) Filed: Nov. 20, 2002

(65) Prior Publication Data

US 2003/0097614 A1 May 22, 2003

Related U.S. Application Data

(63) Continuation of application No. 09/342,162, filed on Jun. 16, 1999, now abandoned.
(60) Provisional application No. 60/089,620, filed on Jun. 16, 1998.

(51) Int. Cl.[7] .............................................. G01R 31/28
(52) U.S. Cl. ........................ 714/726; 714/30; 713/503
(58) Field of Search ................................ 713/503, 502, 713/501, 500; 714/30, 726, 727–739, 718, 724, 763, 814, 725; 327/99; 324/765, 601, 158.1

(56) References Cited

U.S. PATENT DOCUMENTS

| | | | |
|---|---|---|---|
| 4,503,537 A | 3/1985 | McAnney | |
| 5,349,587 A | 9/1994 | Nadeau-Dostie et al. | |
| 5,524,114 A | 6/1996 | Peng | |
| 5,614,838 A | 3/1997 | Jaber et al. | |
| 5,680,543 A | 10/1997 | Bhawmik | |
| 5,717,702 A | 2/1998 | Stokes et al. | |
| 5,740,182 A | * 4/1998 | Narain ...................... | 714/726 |
| 5,812,561 A | 9/1998 | Giles et al. | |
| 5,867,507 A | 2/1999 | Beebe et al. | |
| 6,014,763 A | 1/2000 | Dhong et al. | |
| 6,055,658 A | 4/2000 | Jaber et al. | |
| 6,145,105 A | * 11/2000 | Nadeau-Dostie et al. ... | 714/726 |
| 6,178,532 B1 | 1/2001 | Pierce et al. | |
| 6,199,182 B1 | 3/2001 | Whetsel | |
| 6,286,119 B1 | 9/2001 | Wu et al. | |
| 6,330,681 B1 | 12/2001 | Cote et al. | |

* cited by examiner

Primary Examiner—Guy J. Lamarre
(74) Attorney, Agent, or Firm—Klarquist Sparkman, LLP

(57) ABSTRACT

A scheme for multi-frequency at-speed logic Built-In Self Test (BIST) is provided. This scheme allows at-speed testing of very high frequency integrated circuits controlled by a clock signal generated externally or on-chip. The scheme is also applicable to testing of circuits with multiple clock domains which can be either the same frequency or different frequency. Scanable memory elements of the digital circuit are connected to define plurality of scan chains. The loading and unloading of scan chains is separated from the at-speed testing of the logic between the respective domains and may be done at a faster or slower frequency than the at-speed testing. The BIST controller, Pseudo-Random Pattern Generator (PRPG) and Multi-input Signature Register (MISR) work at slower frequency than the fastest clock domain. After loading of a new test pattern, a clock suppression circuit allows a scan enable signal to propagate for more that one clock cycle before multiple capture clock is applied. This feature relaxes the speed and skew constraints on scan enable signal design. Only the capture cycle is performed at the corresponding system timing. A programmable capture window makes it possible to test every intra- and inter-domain at-speed without the negative impact of clock skew between clock domains.

23 Claims, 7 Drawing Sheets

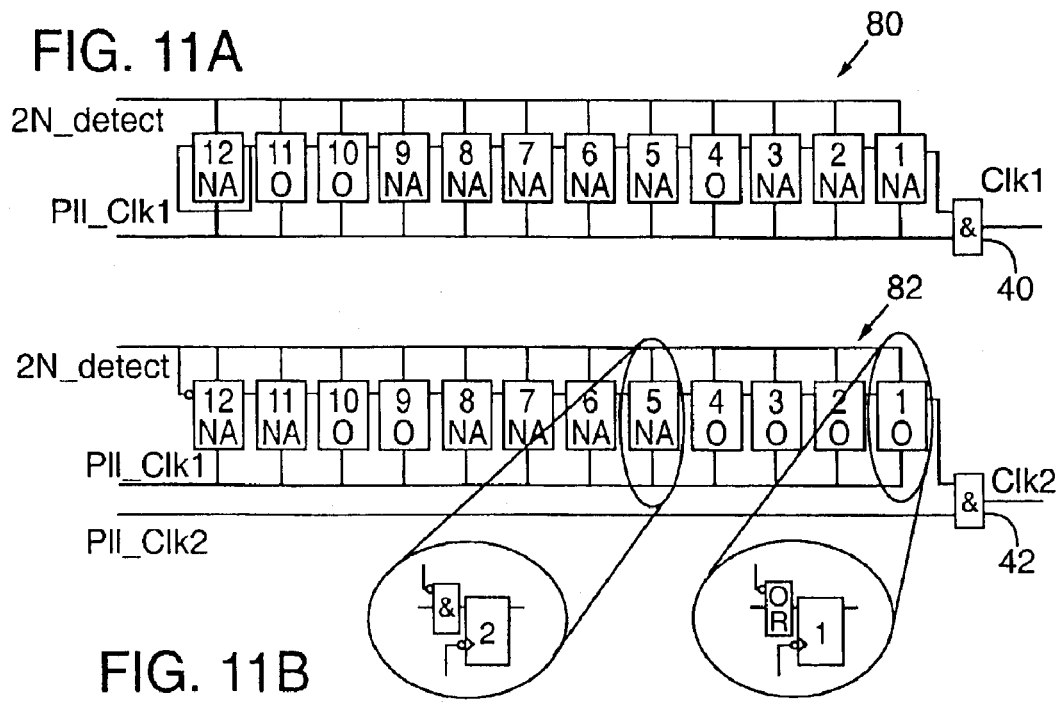
FIG. 11A
FIG. 11B
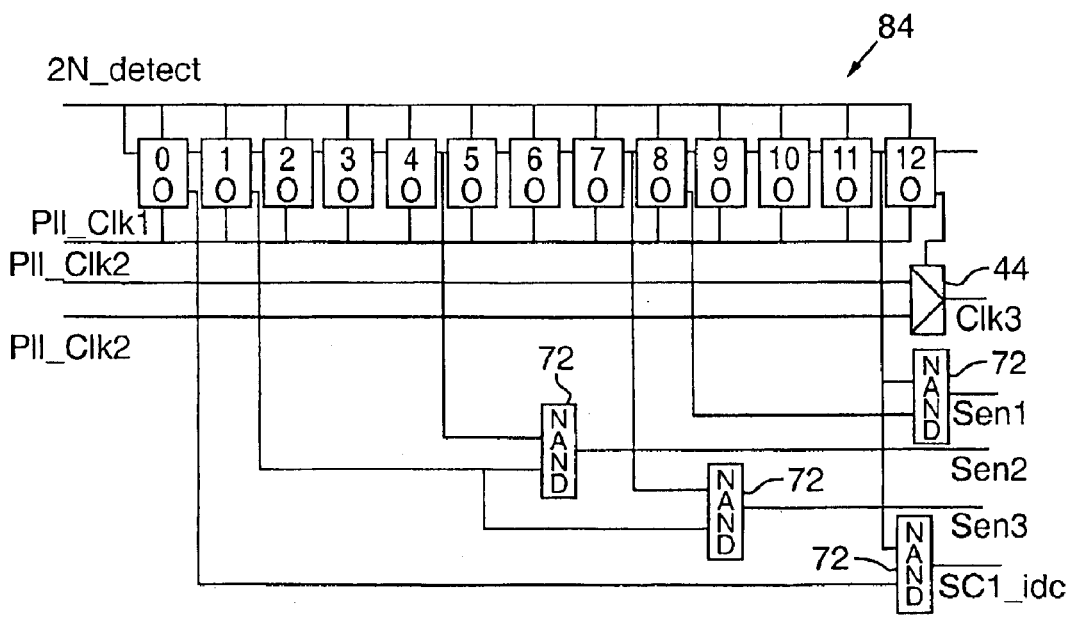
FIG. 12

METHOD AND APPARATUS FOR AT-SPEED TESTING OF DIGITAL CIRCUITS

RELATED APPLICATION DATA

This patent is a continuation of U.S. patent application Ser. No. 09/342,162, filed Jun. 16, 1999, now abandoned which claims priority to U.S. Provisional Patent Application No. 60/089,620, filed Jun. 16, 1998, both of which are incorporated by reference herein.

FIELD OF INVENTION

This invention relates generally to the built-in self testing of integrated circuits (ICs). More specifically, the invention relates to at-speed self-testing of digital circuits that may have multiple clock domains.

BACKGROUND OF THE INVENTION

The difficulty of testing digital integrated circuits is increasing at a rapid pace with the increasing complexity of digital design. This testing typically occurs at the time of a circuit's manufacture, at start-up of a system that includes a circuit, or periodically while the circuit is functioning. With the technology delving into deep sub-micron feature size, digital designs are placing multi-million transistors in a single integrated circuit. Along with the tremendous increase in number of devices, the operating frequency, or clock speed, is reaching into the Gigahertz ($10^9$) range. Access to devices within an IC for test, for example, has become a problem with the increase in device count. The ratio of pin to device is gradually decreasing, resulting in increasing cost of test generation. External testers are also becoming prohibitively expensive for testing multiple hundred Megahertz and Gigahertz frequency digital ICs.

Built-in self-test (BIST) has emerged as a viable alternative to expensive external testing. In general, BIST schemes are based on test stimulus supplied by a pseudo-random pattern generator (PRPG) residing within the IC itself.

Responses to the test stimulus are collected in a response compactor within the IC and made available at the end of the test. Thus, the cost of access, test generation, and expensive tester hardware can be resolved by implementing BIST techniques to test digital ICs.

Although BIST provides an alternative to external test, the issue of the quality of the testing remains the same for both paradigms. The limitation of classical stuck-at fault based testing is well established in present day technology (CMOS, etc.) and deep sub-micron feature size. Shrinking feature size together with multiple layers of metal connections in semiconductor processes is resulting into new failure modes. AC failures are becoming equally important with static failures. Digital ICs today need to be tested for performance at Gigahertz operating frequencies to make sure that the devices can operate at without failure. At-speed testing based on delay fault model is becoming part and parcel of a high quality digital test. BIST schemes thus need to provide for at-speed testing to be effectively applicable to high speed digital ICs.

A basic infrastructure for built-in self-test of digital ICs is described in U.S. Pat. No. 4,503,537. The patent discloses a linear feedback shift register (LFSR) as the source of random patterns. A Multi Input Shift Register (MISR) is used as the unit to collect and compact test responses. Multiple parallel scan chains are connected between the LFSR and MISR for inserting test vectors into the circuit under test and capturing the results. A BIST controller coordinates the loading of scan chains with pseudorandom patterns from the generator. After the loading of a pseudorandom pattern is completed, a single capture clock is applied to capture the responses into the scan chains. Subsequently the responses are shifted out and compressed into a signature. In this method all scan chains are assumed to operate at the same frequency. If the circuit has multiple frequencies, it has to operate at the slowest frequency to allow enough time for signals in those slow domains to propagate reliably to steady states before they are captured. The transitions are generated by the last shift in every loading sequence. All responses are captured simultaneously. Also disclosed therein is the well-known scan technique wherein scan chains are implemented in a digital circuit design by dividing the design into combinational and sequential logic.

As taught in the patent and elsewhere in the literature, the sequential logic is used as scan cells that can be configured into scan chains during testing of the circuit. A typical scan cell contains a two-input multiplexer followed by a sequential or memory element such as a flip flop. The flip flop is an edge-triggered sequential element where input data is latched into the element at the active edge of the clock signal. The multiplexer control signal (known as scan enable, or SE) determines the mode of operation for the scan cells during test: scan or capture. In scan mode, the scan cells are connected in series to form a scan chain and the combinational logic is decoupled from the scan chain. Test stimulus in the form of a test vector of data is brought in from a source such as a PRPG and clocked into the scan chain. In capture mode, data is propagated from input scan cells through functional paths of the combinational logic and captured in output scan cells (which may be the same as or different from the input scan cells). Capture mode exercises the logic's functional paths and hence performs testing of the faults in these structures. After capture, the scan enable changes the cell operation back to scan mode and the captured data is shifted out into a response compactor such as a multiple input signature register (MISR). While the response is shifted out for one scan vector, input data is shifted in for the next scan vector. Shift in and shift out become parallel operations. After the last scan vector is shifted into the MISR, a signature is obtained in the MISR. This signature is compared with a fault-free signature to determine if the digital circuit is fault-free.

In BIST, therefore, there are two distinct operations during test: scan and capture. The scan operation shifts test data into a scan chain. Once there, the test data is available in the scan chain for propagation through the circuit. The capture operation then captures the test data response after the data has propagated through the circuit, normally within one clock cycle of the digital circuit's clock. The scan operation then shifts the response out of the scan chain The quality of at-speed testing is determined by two edges of the functional clock. The clock edge at which the last shift occurs is the update edge. The update edge applies the test vector to the combinational logic. The capture edge is the clock edge at which the memory elements capture the test vector response. An alternative scheme uses the capture clock to provide both update and capture edges.

The minimum time between an update edge and a following capture edge is the time allowed for the data to propagate through the combinational logic. This time window is termed the "at-speed path." FIGS. 1A and 1B illustrate the concept of an at-speed path. FF22 is the driving end flip flop and FF24 is the receiving end flip flop. In FIG. 1A, a last shift updates data into FF22 at the rising edge of the clock that provides the circuit's operating frequency. At the next rising edge of the clock, data is captured into FF24. Thus, one clock cycle is the at-speed path in the first case. In FIG. 1B, a last shift updates data into FF22 at the falling edge of the clock. At the next rising edge, data is captured into FF24. Thus, about one-half clock cycle is the at-speed path in the second case.

Testing of digital circuits is ideally done at the speed that the circuits are normally clocked (at-speed testing). As clock speeds have reached Gigahertz frequencies, this had led to problems with the scan operation data in BIST. First, shifting data through a scan chain results in simultaneous switching of large number of signals. At high clock speeds, this shifting and switching generates very high power and heat that can damage the circuit under test. Second, at-speed shifting often provides insufficient time for the scan enable control signal to change from a scan to capture state before the arrival of the capture edge of the clock.

In addition to problems with scan operations during at-speed testing, another challenge faced by BIST schemes is handling the multiple clock domains typically found in complex digital ICs. Each clock domain (which includes a scan chain and possibly other logic) has its own operating frequency. Interaction of these clock-domains results in additional complexity in at-speed testing. Both under-testing (testing at slower than the normal operating frequency) and over-testing (testing at faster than the normal operating frequency) can affect the quality and yield of the IC.

The above definition of an at-speed path also applies in digital circuits that have multiple clock domains with multiple clock frequencies. FIG. 2 shows a typical digital circuit having three clock domains. Each clock domain has a scan chain (SC1, SC2, and SC3) and an operating frequency (F1, F2, and F3, respectively) provided by a clock (CLK1, CLK2, and CLK3, respectively). Frequency F1 is greater than F2, and F2 is greater than F3. The timing relationships for the various at-speed paths are shown in FIGS. 3A–E. Assuming all the scan elements in these scan chains are rising edge flip flops, the definition of at-speed test for intra-clock domains are shown in FIG. 3B. For example in clock domain CLK1, at-speed path $p_{11}$ is between two consecutive rising edges of CLK1. The driving end flip flop F22 updates data on rising edge t1 and receiving end flip flop F24 captures data on the next rising edge t2. Inter-clock domain at-speed paths are shown in FIGS. 3C–E. For example, path $p_{12}$ in FIG. 3C is an at-speed path between CLK1 and CLK2, beginning at rising edge t2 on CLK1 and ending at rising edge t3 on CLK2. Path $p_{12}'$, however, is not an at-speed path because there is an intervening update edge t2 update edge t1 and capture edge t3. Similarly in, $p_{21}$ in FIG. 3C is an at-speed path between CLK2 and CLK1, $p_{31}$ and $p_{13}$ in FIG. 3D are at-speed paths between CLK1 and CLK3, and $p_{32}$ and $p_{23}$ in FIG. 3E are at-speed paths between CLK2 and CLK3.

Method and apparatus for testing digital circuits with multiple clock domains are known, but each has significant drawbacks. U.S. Pat. No. 5,680,543, for example, discloses testing the multiple clock domains sequentially rather than in parallel, which lengthens the test. Moreover, inter-domain testing (where two clocks affect combinational logic through which the test data is propagated) is not done at speed, providing flawed results. Another limitation of the described scheme is a limited ability to deal with clock skews (the inability to simultaneously clock a circuit with clocks from two domains). Similarly, U.S. Pat. No. 5,349,587 advocates simultaneous capture in multiple clock domains, which makes this scheme sensitive to clock skew between domains. Furthermore, inter-domain testing is not done at speed. Moreover, the scan enable signal changes during the active edge of the clock, which may create a highly undesirable race condition.

An objective of the invention, therefore, is to provide a method and apparatus for providing accurate, at-speed testing of digital circuits that may have multiple clock domains.

SUMMARY OF THE INVENTION

A method for testing a digital circuit that includes combinational logic and a scan chain of memory elements is disclosed. The method includes clocking a test pattern into the memory elements of the scan chain at a shift frequency. The digital circuit is then clocked at an operating frequency different from the shift frequency, thereby launching the test pattern into the combinational logic. A response to the test pattern in then captured in the scan chain.

In an aspect of this method, the shift frequency is derived from the operating frequency. A slower shift frequency is obtained by suppressing pulses of the clock that provides the operating frequency. A faster shift frequency is obtained by multiplexing clock pulses that provide the operating frequency with clock pulses that provide a higher frequency.

Also disclosed is a method for testing a digital circuit that includes combinational logic interconnecting at least two interactive clock domains clocked at respective operating frequencies. The method includes providing a test pattern in the memory elements of a scan chain in the first clock domain. Each clock domain is then clocked at the domain's respective operating frequency, thereby launching the test pattern into the combinational logic. At a first time thereafter, a response to the test pattern is captured in the memory elements of a scan chain in one clock domain but not the other clock domain. This avoids the problems associated with clock skew when two clock domains attempt to simultaneously capture a test pattern response.

In an aspect of this method, the test pattern response is captured in the other clock domain at a second time different from the first time.

Also disclosed is a method for at-speed inter-domain testing of digital circuits where a test pattern is launched from a clock domain of a slower operating frequency and captured in a clock domain of a faster operating frequency.

The foregoing and other aspects of the invention will become more apparent from the following detailed description of a preferred embodiment which proceeds with reference to the accompanying drawings.

BRIEF DESCRIPTION OF THE DRAWINGS

FIGS. 11A–B are more detailed block diagrams of the second embodiments of the clock suppression circuits.

FIG. 12 is a more detailed block diagram of the second embodiment of the control signal generator.

DETAILED DESCRIPTION OF ILLUSTRATIVE EMBODIMENTS

Figure 1A:
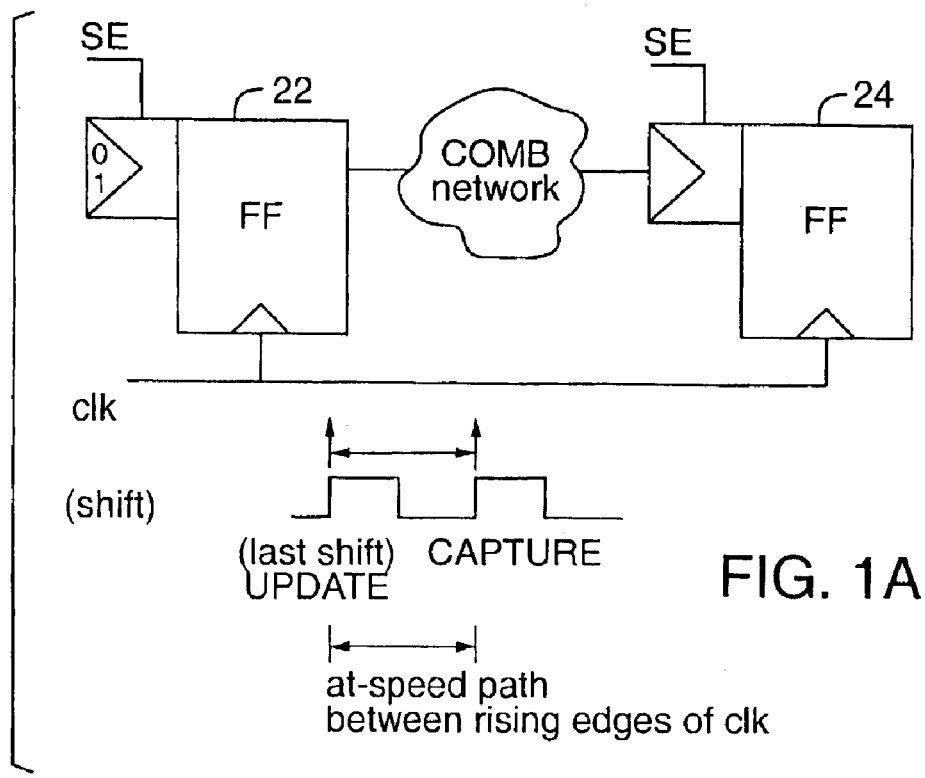
FIGS. 1A–B illustrate the operation of a scan chain.
Figure 1B:
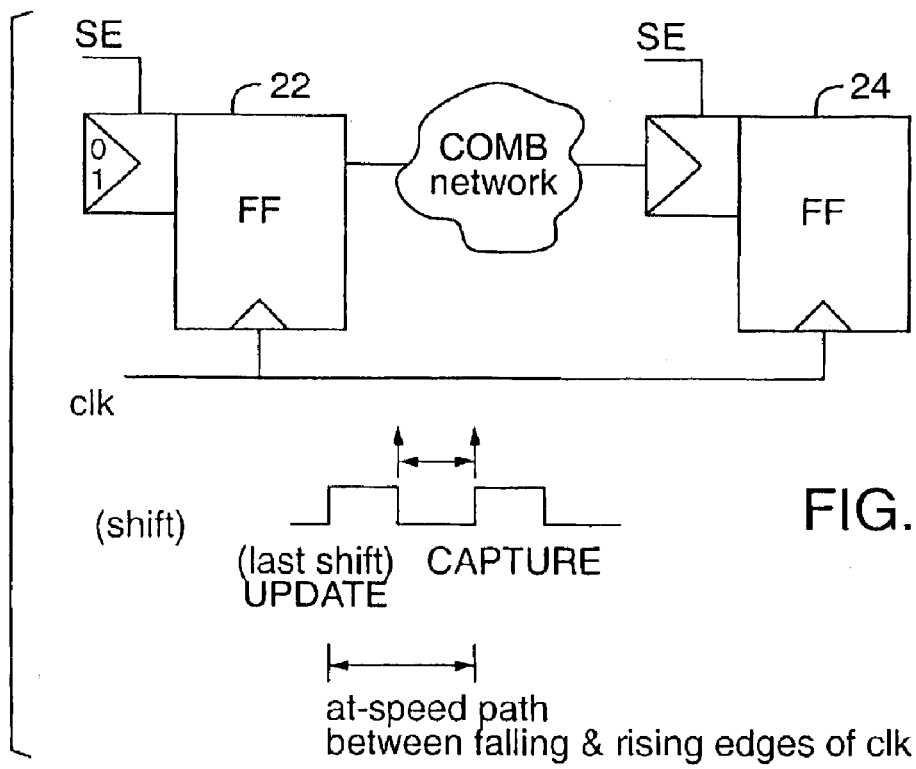
Figure 2:
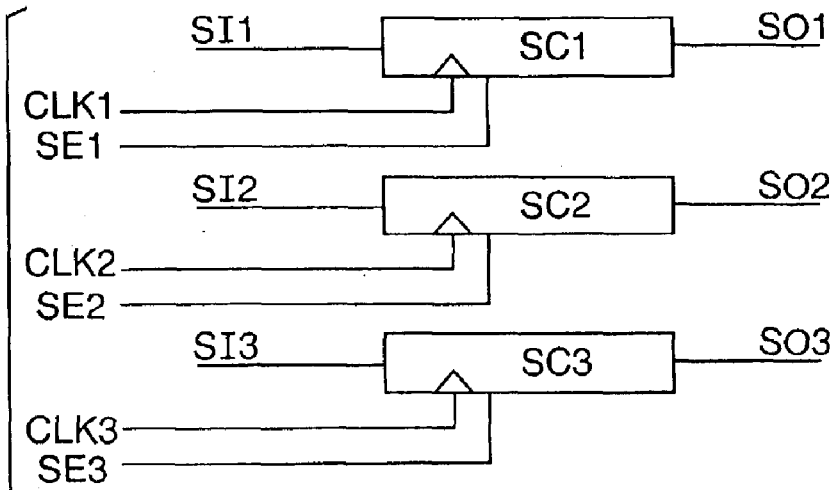
FIG. 2 is a block diagram of a digital circuit having three scan chains.
Figure 4:
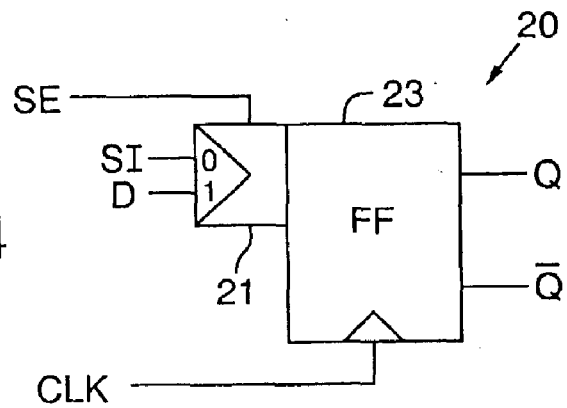
FIG. 4 is a block diagram of a memory element such as a flip flop used as a scan cell in a scan chain.

FIG. 4 is a block diagram of a memory element 20 such as a flip flop used as a sequential logic in a digital circuit and as a scan cell in a scan chain. The element includes a two-input multiplexer 21 coupled to the input of an edge-triggered flip flop 23. The two inputs to the multiplexer are data (D) and scan input (SI). The multiplexer control signal is called scan enable (SE) and it determines which of the multiplexer inputs are passed through to flip flop 23. The signal SE selects a test vector as input when the signal is in the scan state and selects data as input when the signal is in the capture state. The flip flop 23 (and hence memory element 20) is clocked by CLK. When the scan enable signal is in the scan state, CLK clocks a test pattern, or vector, sequentially via the SI input through the memory elements within the scan chain until the test vector is completely loaded therein. The combinational logic of the circuit design is decoupled from the scan chain during this scan operation. When the scan enable signal is in the capture state, the combinational logic is coupled to the scan chain and the memory elements capture via their D inputs a response of the digital circuit to the test vector. The scan enable signal then switches back to the scan state to shift the test vector response out of the scan chain and to simultaneously shift in another test vector. This process repeats until the testing of the digital circuit completes.

Figure 5:
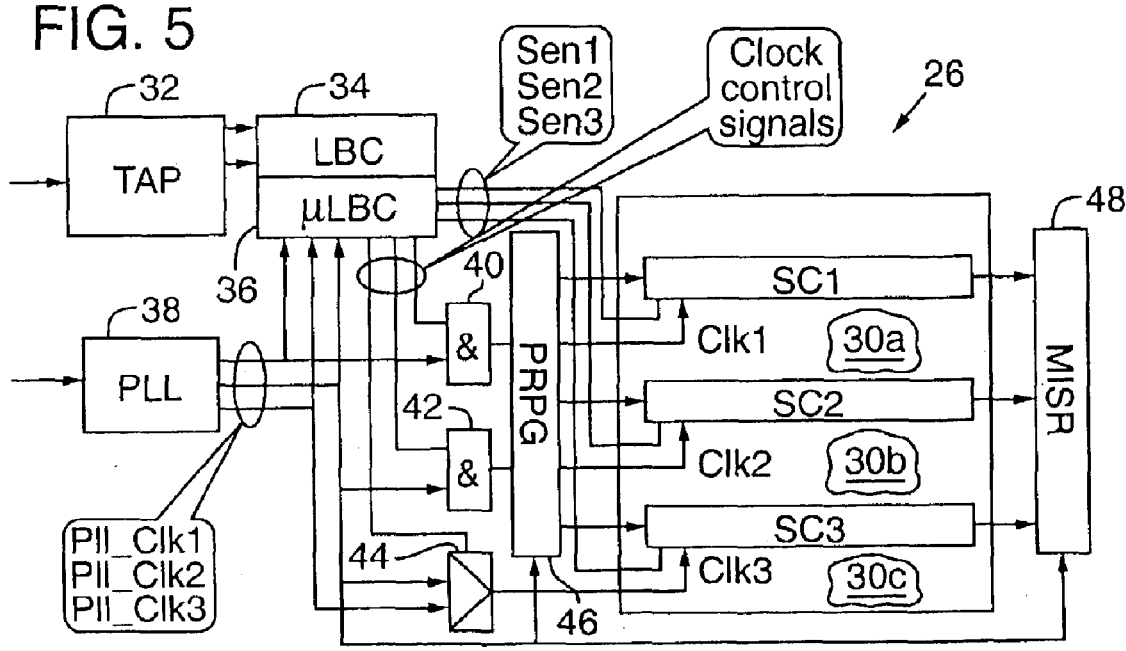
FIG. 5 is a block diagram of an at-speed multi-frequency BIST architecture in accordance with the invention.
Figure 3A:
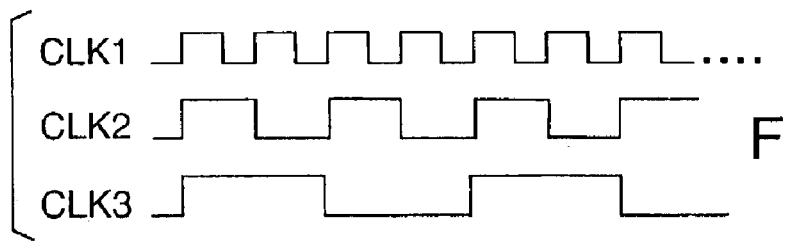
FIGS. 3A–E are timing diagrams of the multiple clock domains in a multi-frequency digital circuit illustrating the at-speed paths within and between clock domains.
Figure 3B:
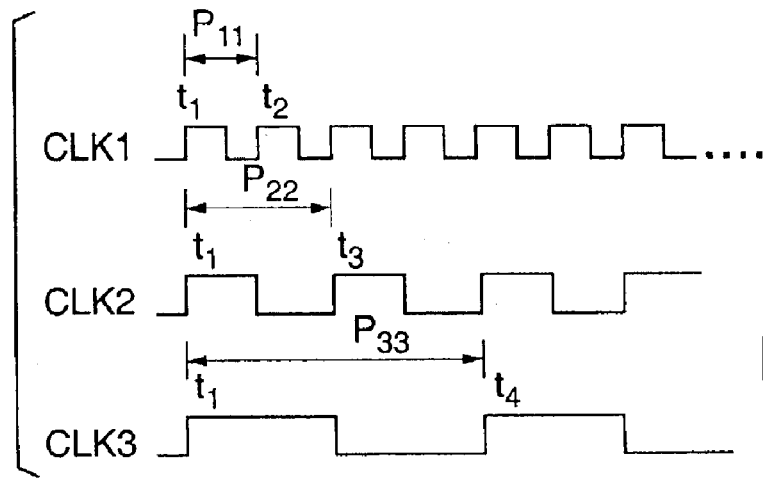
Figure 3C:
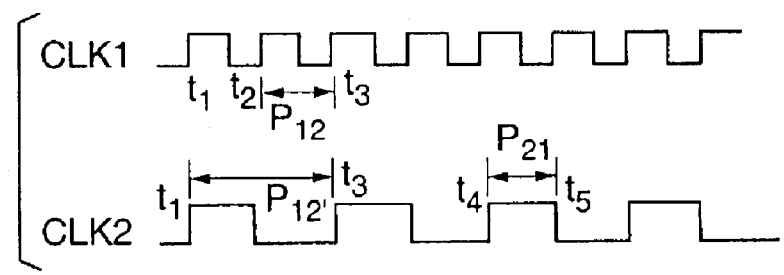
Figure 3D:
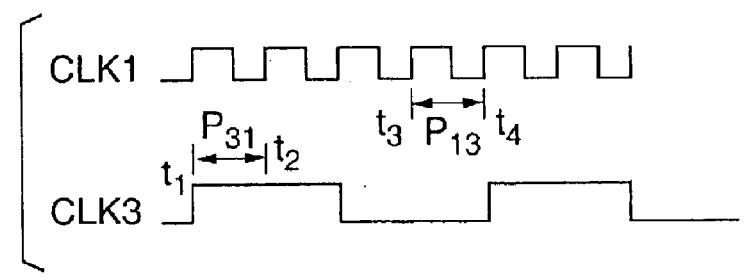
Figure 3E:
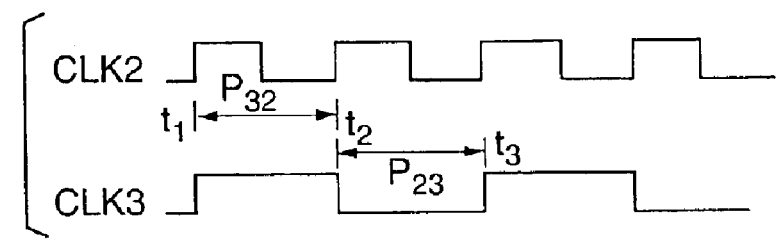

FIG. 5 is a block diagram of an at-speed multi-frequency BIST architecture 26 in accordance with the invention. In the center of the diagram is a digital circuit 28 to be tested. The circuit includes a number of scan chains such as SC1, SC2, and SC3 and combinational logic 30a–c. The scan chains are comprised of scan cells such as the memory element 20. Each scan chain is clocked by a separate clock CLK1, CLK2, and CLK3, respectively, which are typically synchronous and may provide the same or different operating frequencies. When different, the faster frequencies are typically multiples of the slowest frequency. Each scan chain and associated clock form a clock domain in the digital circuit. The combinational logic 30 is interconnected with each of the scan chains and can be tested intra-domain or inter-domain, as will be described. For example, combinational logic 30a is tested intra-domain by launching a test vector from chain SC1 into logic 30a and capturing the test vector response in chain SC1. The same logic is tested inter-domain by launching a test vector from chain SC1 into logic 30a and capturing the test vector response in chain SC2.

The architecture 26 also includes a test access point (TAP) 32 test interface that enables the architecture to be put in a test mode or normal mode. The TAP 32 communicates with a logic BIST controller (LBC) 34 that is coupled to a micro BIST controller (MBC) 36. The MBC receives as input three clocks Pll_Clk1, Pll_Clk2, and Pll_Clk3 from a clock source such as a phase-locked loop (PLL) 38 operating at frequencies F1, F2, and F3 respectively. The MBC 36 generates the scan enable signals Sen1, Sen2, Sen3 that are applied to the scan chains when the digital circuit is in test mode. It also provides output that is logically combined with the clocks Pll_Clk1, Pll_Clk2, and Pll_Clk3 at AND gates 40, 42 and multiplexer 44, respectively to generate the clocks CLK1, CLK2, and CLK3.

The LBC 34 includes a pattern counter for counting the number of patterns tested and a shift counter for tracking the number of shifts in the scan mode and capture mode. The test patterns are supplied by a pseudo-random pattern generator (PRPG) 46 to the scan chains in response to a command from the LBC 34. The test pattern responses that are shifted out of the scan chains are compacted in a multi-input signature register (MISR) 48, from where they are compared against a fault-free signature. The PRPG and MISR may be of conventional design.

Figure 6:
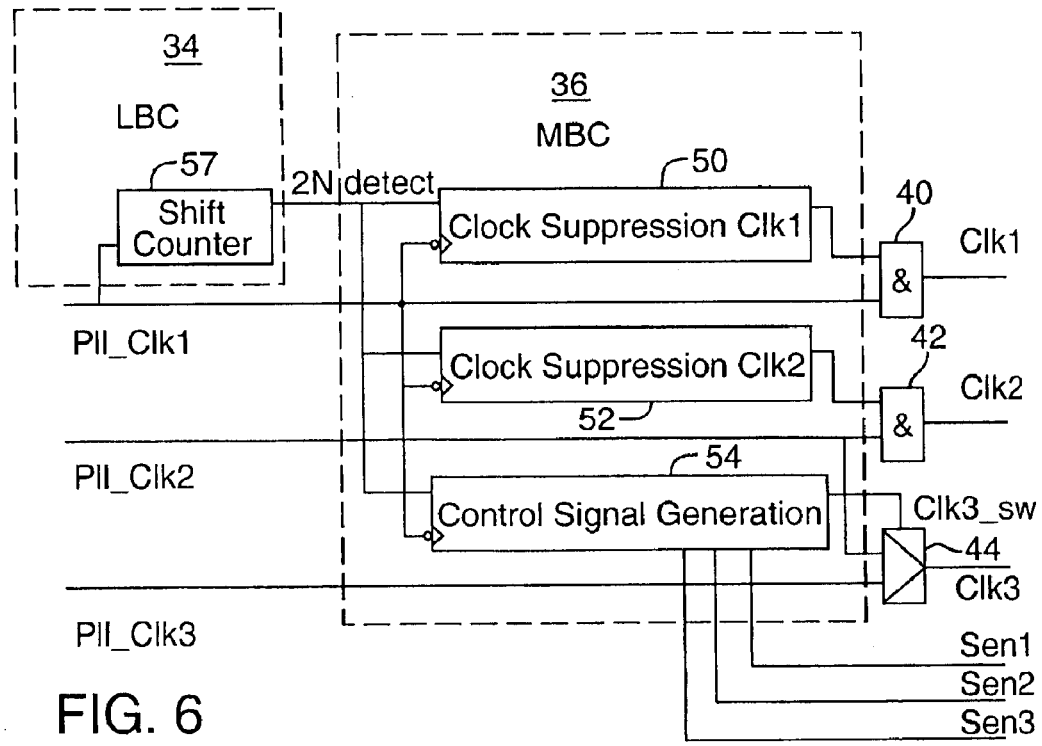
FIG. 6 is a more detailed block diagram of a part of the architecture of FIG. 5, showing a first embodiment of clock suppression circuits and a control signal generator.

FIG. 6 is a more detailed block diagram of the MBC 36, showing a first embodiment of clock suppression circuits 50, 52 and a control signal generator 54. Also shown for context in FIG. 6 is a shift counter 57 within the LBC 34, AND gates 40, 42, and multiplexer 44. The shift counter 57 is driven by the fastest PLL clock Pll_Clk1 and, at the end of the shift operation that loads a test pattern into the scan chains, generates a detect signal for one clock cycle. This signal causes the clock suppression circuits 50, 52 and the control signal generator 54 to execute the capture operation and capture the test pattern responses. After that, the LBC returns to the scan operation to shift the test pattern responses out of the scan chains and a new test pattern in. The shift counter 57 tracks the shift of the test pattern into the scan chains and again causes the clock suppression circuits 50, 52 and the control signal generator 54 to execute the capture operation once the test patters are fully loaded. As part of the scan and capture operations, the control signal generator also drives the SE signals to their scan and capture states.

Figure 7:
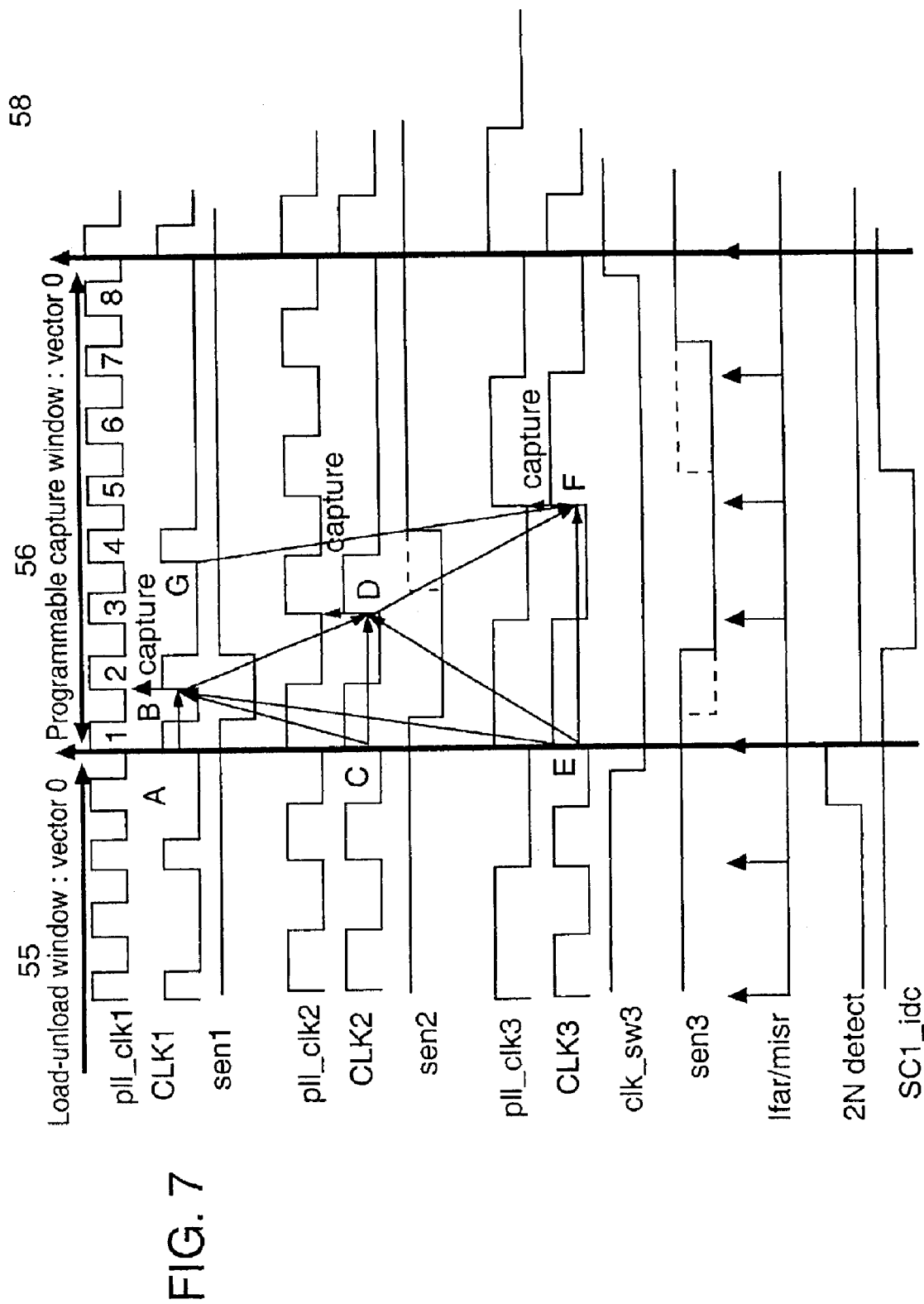
FIG. 7 is a timing diagram for the BIST architecture that includes a first embodiment of clock suppression circuits and a control signal generator of FIG. 6.

Detailed operation of the BIST architecture 26 is best understood with reference to FIG. 7, which is a timing diagram for the BIST architecture when the circuit 28 is being tested. The timing diagram has two parts: a load/unload window 55 and a capture window 56. During the load/unload window, the circuit 28 is in a scan mode which is comprised of multiple shift operations to load (and unload) test patterns into (and out of) the scan chains. During the capture window, the circuit 28 is in a capture mode in which test pattern responses are captured in the different clock domains at various times. The capture window is programmable in the sense that the time within the window when a test pattern response is captured by a scan chain can be varied by suppressing clock pulses within the clock domains.

In this embodiment loading of all scan chains preferably occurs in parallel and at the same shift frequency F2. Scan chain SC1 uses a faster frequency F1 during its normal operation and during its capture mode. This frequency is reduced to F2 during its scan mode using the clock suppression circuit 50, such as by suppressing every other pulse of clock Pll_Clk1. By reducing the shift frequency for SC1 from F1 to F2, problems of power consumption and overheating are avoided. Scan chain SC2 is clocked by Clk2 which is driven by Pll_Clk2. Since the frequency of Pll_Clk2 is F2, no modification of this clock is necessary for the scan mode. Scan chain SC3 is driven by clock Pll_Clk3 of slower frequency F3 in its normal operation and during the capture mode. A faster CLK3 of frequency F2 is produced during the scan mode by multiplexing pulses from clock Pll_Clk2 with pulses from clock Pll_Clk3 using multiplexer 44. By increasing the shift frequency for SC3 from F2 to F3, the time required for shifting test patterns through the scan chain in considerably reduced. While the shift frequency for each domain is the same F2 in this embodiment, this is not a necessary feature.

The capture window begins the capture process. At its start each clock domain has a test vector loaded within its scan chain. Each clock domain then enters a capture mode when its scan enable signal (Sen1, Sen2, or Sen3) changes from the scan state (logic 1) to the capture state (logic 0). During the capture mode the domain clocks operate at their normal operating frequencies so that testing is at speed. For clock domain CLK1, its shift frequency F2 is slower than its operating frequency F1. For clock domain CLK3, its shift frequency F2 is faster than its operating frequency F3. For clock domain CLK2, its shift frequency F2 is the same as its operating frequency F2.

The unloading of the scan chains in the load/unload window is performed in the same manner as the loading of the scan chains. After eight clock cycles of Pll_Clk1 in the capture window 56, all domains have captured their test responses and the scan enable signal in each domain is back in the scan state. Each clock CLK1, CLK2, and CLK3 then simultaneously generates a rising edge at the beginning of the window 55 to begin shifting the test pattern response out of the scan chains at frequency F2 and to shift in another test pattern if one is present.

Accurate, at-speed testing of a digital circuit requires that the combination logic be tested within one clock cycle of the fastest clock applied to the circuit. For intra-domain testing, the clock cycle is that of the clock that provides the operating frequency for the clock domain. In clock domain CLK1, the test pattern is loaded at rising edge A and the response is captured at rising edge B, within one clock cycle of CLK1 after the test pattern is propagated through the combinational logic. The SE signal for SC1 changes from the scan state to the capture state about halfway through that clock cycle and has reached the memory elements of the scan chain before edge B. The same is true within clock domains CLK2 and CLK3. In CLK2, the test pattern is loaded at rising edge C and captured at rising edge D, within one clock cycle of CLK2 after the test pattern is propagated through the combinational logic. The SE signal for SC2 changes from the scan state to the capture state before halfway through that clock cycle and has reached the memory elements of the scan chain before edge D. In CLK3, the test pattern is loaded at rising edge E and captured at rising edge F, within one clock cycle of CLK3 after the test pattern is propagated through the combinational logic. The SE signal for SC3 changes from the scan state to the capture state before halfway through that clock cycle and has reached the memory elements of the scan chain before edge F.

For inter-domain at-speed testing, two clock domains are involved, with the clock cycle being that of the clock that provides the faster operating frequency. Six examples are highlighted in FIG. 7. In these examples the clock that controls the scan chain containing the test pattern is referred to as the launch clock and the clock that controls the scan chain receiving the test pattern response is referred to as the capture clock. In a first example, a test pattern is launched from scan chain SC2 in clock domain CLK2 at rising edge C and captured in scan chain SC1 in clock domain CLK1 at rising edge B. The clock cycle for the test is that of CLK1, which provides a faster operating frequency than CLK2. In a second example, a test pattern is launched from scan chain SC1 in clock domain CLK1 at rising edge G and captured in scan chain SC3 in clock domain CLK3 at rising edge F. The clock cycle for the test is that of CLK1, which provides a faster operating frequency that CLK3. In a third example, a test pattern is launched from scan chain SC3 in clock domain CLK3 at rising edge E and captured in scan chain SC2 in clock domain CLK2 at rising edge D. The clock cycle for the test is that of CLK2, which provides a faster operating frequency that CLK3.

The nine capture relationships in this digital circuit (the three intra-domain and six inter-domain) are detailed in Table 1.

TABLE 1

|  |  | Capture clock | | | |
|---|---|---|---|---|---|
|  |  | Clk1 | Clk2 | Clk3 | Length |
| Launch clock | Clk1 | 1–2 | 2*–3 | 4**–5 | 1 |
|  | Clk2 | 1–2 | 1–3 | 3*–5 | 2 |
|  | Clk3 | 1–2 | 1–3 | 1–5 | 4 |

The * in the table indicates a launch obtained by capture of a test pattern response to an earlier test pattern. The ** indicates a launch by shift of previously captured data.

To avoid clock skew and the problems such as race conditions that follow therefrom, no two interactive clock domains are permitted to have simultaneous active edges. This might occur if there is an attempt to simultaneously capture a test pattern response in two interactive domains, or to load a test pattern in the one domain while trying to simultaneously capture a response in another clock domain. Assume, for example, that there are two interactive clock domains interconnected by combinational logic. Assume further that a test pattern is provided in the memory elements of a scan chain in the first clock domain. This pattern may be provided, as noted above, by a load or a capture of a test pattern response. Both domains are clocked at their respective operating frequencies (which may the same or different), thereby launching the test pattern into the combinational logic. At a first time, a response to the launched test pattern is captured in the memory elements of one clock domain but not the other domain. In some cases, at a second time different from the first (either before or after), a response to the test pattern is captured in the memory elements of a scan chain in the other clock domain.

This method of testing is illustrated in FIG. 7, where the two domains are CLK1 and CLK2. At the rising edge of the first pulse of Pll_Clk1 in capture window 56, a test pattern is present at A in the scan chain of domain CLK1. The two domains are clocked at this point at their respective operating frequencies, CLK1, and CLK2. At the rising edge of the second pulse of Pll_Clk1 in capture window 56, a response to the test pattern is captured in domain CLK1 at B, but not in domain CLK2. This separation of the capture times avoids the clock skew and resultant race conditions. Later, at the rising edge of the third pulse of Pll_Clk1 in capture window 56, a response to the test pattern is captured in domain CLK2 at D. Similarly, if domain CLK2 is considered the first domain, a test pattern is present at C in the memory elements of its scan chain at the rising edge of the first pulse of Pll_Clk1. The two domains are clocked at this point at their respective operating frequencies, CLK1, and CLK2. At the rising edge of the second pulse of Pll_Clk1 in capture window 56, a response to the test pattern is captured in domain CLK1 at B, but not in domain CLK2. Later, at the rising edge of the third pulse of Pll_Clk1 in capture window 56, a response to the test pattern is captured in domain CLK2 at D.

Simultaneous active edges can be avoided by using clocks of different frequencies and by selectively suppressing pulses of other clocks when one is in capture mode. Note, for example, that the pulse of clock CLK1 is suppressed at the third pulse of the Pll_Clk1 in the capture window to avoid CLK1's rising edge being active simultaneously with CLK2's rising edge. This suppression technique is especially useful when the clock domains have the same operating frequency and the clocks are synchronous.

Figure 8A:
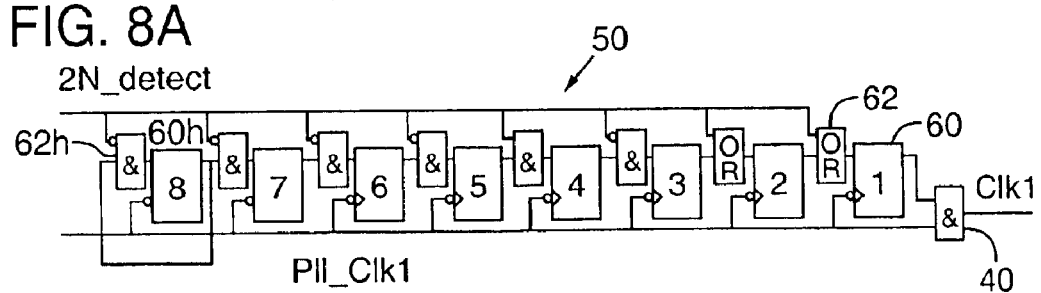
FIGS. 8A–B are more detailed block diagrams of the first embodiments of the clock suppression circuits.
Figure 8B:
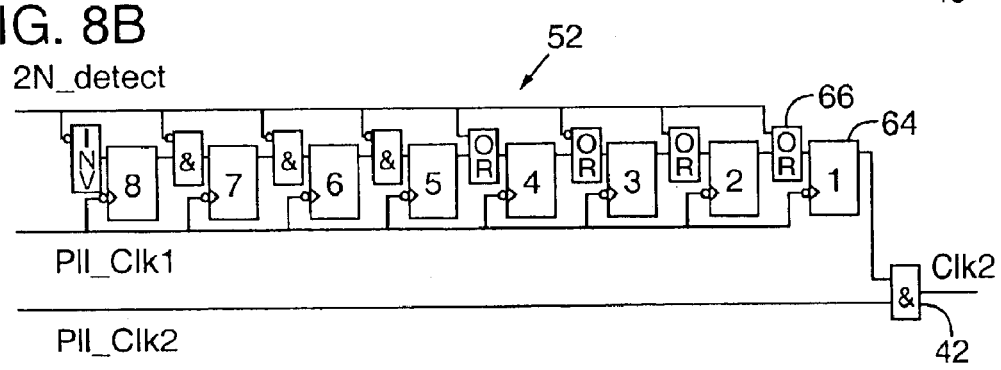
Figure 9:
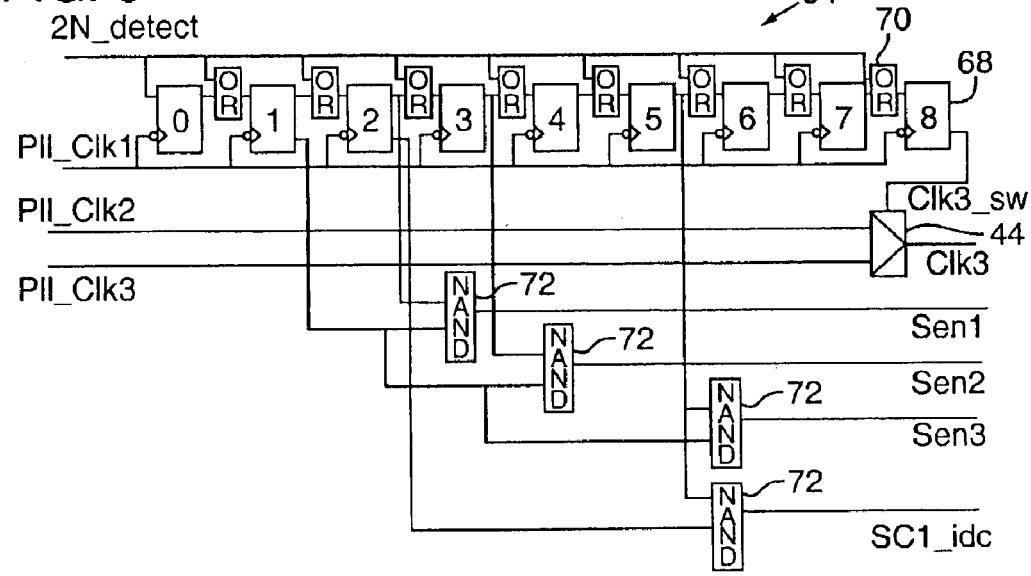
FIG. 9 is a more detailed block diagram of the first embodiment of the control signal generator.

FIGS. 8A–B are more detailed block diagrams of first embodiments 50, 52 of the clock suppression circuits, and FIG. 9 is a more detailed block diagram of a first embodiment 54 of the control signal generator. In circuit 50, the flip flops 60 are configured with logic 62 to generate, upon receipt of the detection signal, a train of clock pulses. 11010000 during the capture window at frequency F1. These pulses are combined with Pll_Clk1 at AND gate 40 to produce CLK1. After these pulses, the feedback of Q' from flip flop 60$h$ into logic 62$h$ causes the output of the circuit 50 to toggle during the load/unload window. When combined with Pll_Clk1 at AND gate 40, this toggling produces a CLK1 with a shift frequency F2, half of the operating frequency F1. Shift counter 57 counts the shifts of the test vector into scan chain SC1 and generates another detection signal when the shift is complete. Circuit 52 includes flip flops 64 and logic 66 that works in the same manner to produce CLK2 during the scan and capture modes of the test operation. The circuit 52 is clocked by Pll_Clk1 at frequency F1 to generate a train of pulses 11110000. These pulses are combined at AND gate 42 to produce CLK2 during the capture window. After these pulses, the output of circuit 52 is a steady stream of pulses at frequency F1 which are combined with the pulses of Pll_Clk2 to produce CLK2 at shift frequency F2. The control signal generator 54 includes flip flops 68 and logic 70 to produce a multiplexer select signal Clk3_sw for multiplexer 44. Circuit 56 is also clocked by Pll_clk1. The select signal it produces selects Pll_Clk2 during the scan mode and Pll_Clk3 during the capture mode, thus providing a shift frequency of F2 and an operating frequency of F3. Signal generator 54 also includes NAND gates 72 whose inputs from various of the flip flops 68 and logic 70 produce the scan enable signals that switch the scan cells between scan and capture mode during a test operation.

In the timing diagram of FIG. 7, the scan enable signal for each clock domain is shown changing successfully from the scan state to the capture state within one clock cycle of the domain's clock. Thus when the scan chain is clocked to capture the response, the memory elements are properly configured to do so. This, however, may not always occur. In some circuit designs, the clock domains have extremely fast operating frequencies and the scan enable signals cannot change state within one clock cycle where. The result is likely the capture at some point of an invalid test pattern response.

Figure 10:
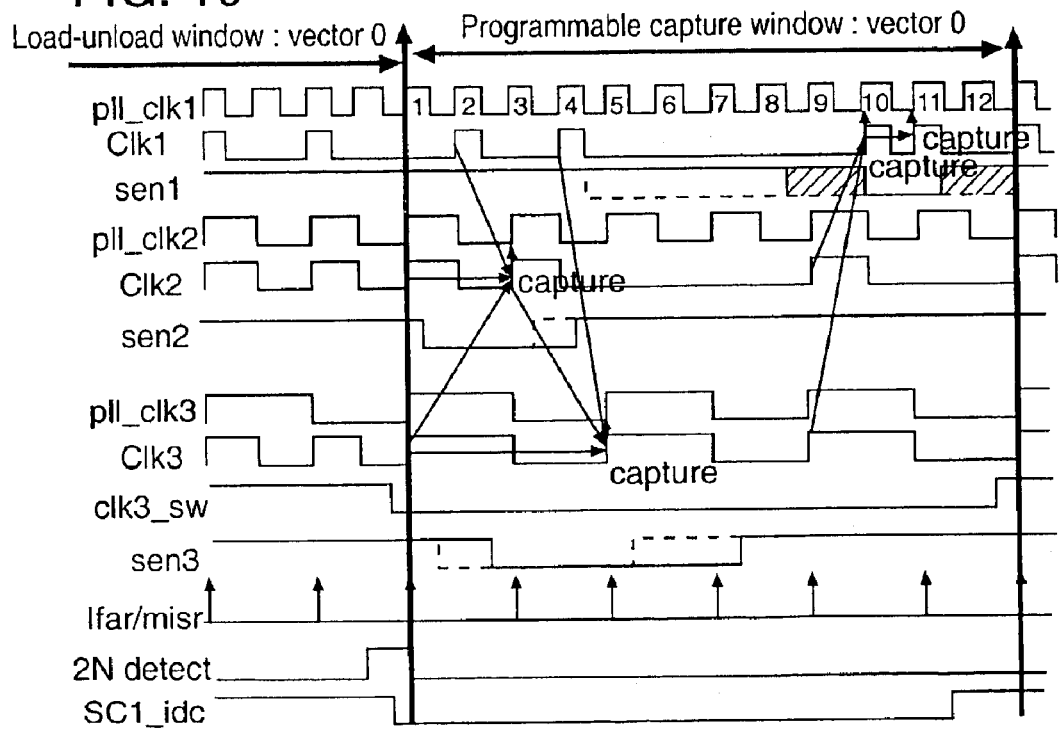
FIG. 10 is a timing diagram for the BIST architecture that includes a second embodiment of clock suppression circuits and a control signal generator of FIG. 6.
Figure 6:
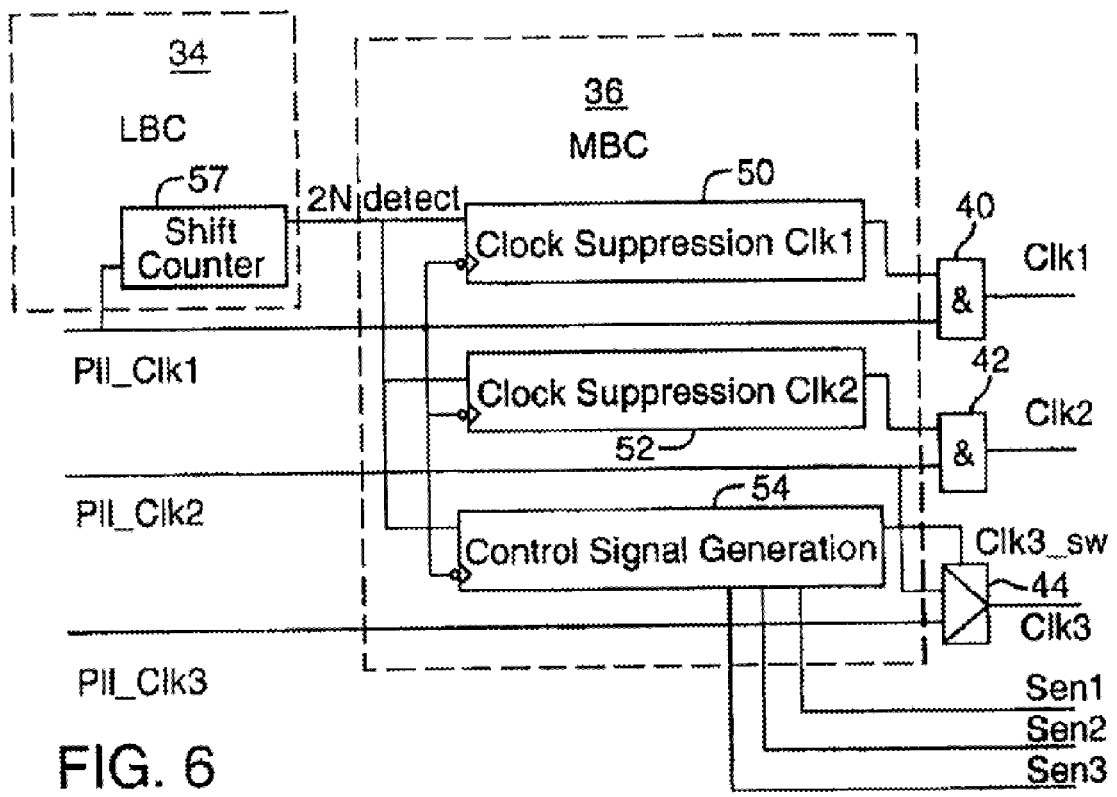
Figure 8A:
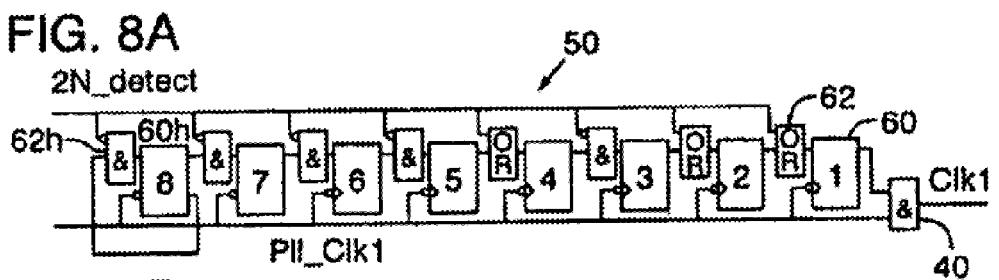
Figure 8B:
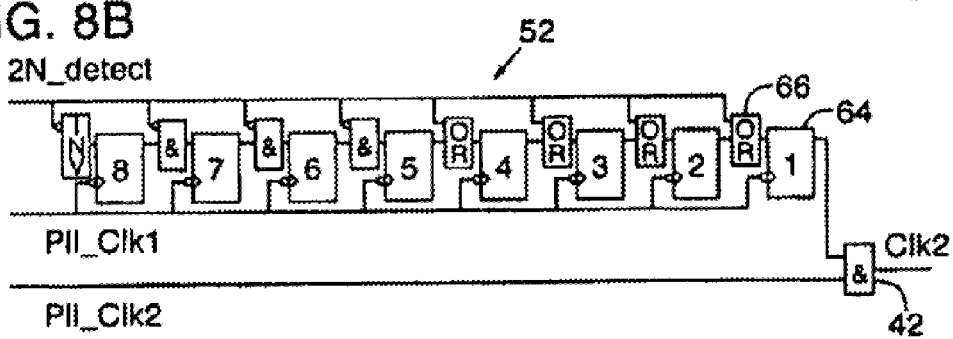

A solution to this problem is provided in the block diagrams of FIGS. 11A–B and 12 and illustrated in the timing diagram of FIG. 10. Scan enable signal Sen1 changes from the scan state to the capture state at the falling edge of eighth pulse of Pll_Clk1 in the capture window 56. This change occurs, however, well after CLK1 has shifted the test pattern into scan chain SC1 initially at rising edge of the second pulse and again at the rising edge of the fourth pulse. To obtain at-speed testing, CLK1 is suppressed from the rising edge of the fifth pulse until the rising edge of the tenth pulse, at which it clocks the scan chain. This allows signal Sen1 a switching time of 1.5 clock cycles of Pll_Clk1, and signal Sen1 could change state as early as the falling edge of the fourth pulse if more time were required. A test pattern response is successfully captured at the rising edge of the tenth pulse (thereby launching it as another test pattern) and one cycle later again at the rising edge of the eleventh pulse.

Signal Sen1 is in the capture mode during this clock cycle, and SC1 successfully captures the test pattern response at the rising edge of the eleventh pulse. Signal Sen1 then switches back to the scan mode at the falling edge of the eleventh pulse. This allows a switching time of 1.5 cycles of Pll_Clk1 before the test pattern response is shifted out of scan chain SC1.

Scan enable signal Sen2, for clock domain Clk2, changes from scan to capture state at the falling edge of the first pulse of Pll_Clk1 and from the capture to scan state at falling edge of the fourth pulse. Signal Sen3 changes from the scan to capture state at the falling edge of the second pulse and from the capture to scan state at the falling edge of the seventh pulse. Both of these scan enable signals have flexibility as to when these state can be changed, if such a change were necessary to provide at-speed testing.

Clock control signal Clk3_sw changes from high to low at the falling edge of the last pulse (2N) of Pll_Clk1 in the load/unload window. It changes back to high again at the falling edge of the twelfth pulse 12 in the capture window.

The nine capture relationships in this digital circuit (the three intra-domain and six inter-domain) are detailed in Table 2.

TABLE 2

|  |  | Capture clock | | | |
| --- | --- | --- | --- | --- | --- |
|  |  | Clk1 | Clk2 | Clk3 | Length |
| Launch clock | Clk1 | 10–11 | 2**–3 | 4**–5 | 1 |
|  | Clk2 | 9***–10 | 1–3 | 3*–5 | 2 |
|  | Clk3 | 9***–10 | 1–3 | 1–5 | 4 |

The * indicates a launch obtained by capture. The  indicates a launch by shift within the capture window. The * indicates a launch obtained by a shift of captured data.

FIGS. 11A–B are block diagrams of second embodiments 80, 82 of the clock suppression circuits and FIG. 12 is a block diagram of a second embodiment 84 of the control signal generator. These circuits suppress certain pulses of CLK1 and CLK2 so that the capture state of scan enable signal Sen1 can reach the memory elements of scan chain SC1 before the memory elements are clocked to capture a test pattern response. The circuits are similar in operation to the circuits shown in FIGS. 8A–B and 9, with the difference being the length and nature of the pulse train output by each circuit. During the capture window, circuit 80 generates a pulse train of 010100000110, circuit 82 generates a pulse train of 11110001100, and generator 84 generates a pulse train of 111111111111.

Having illustrated and described the principles of the invention in illustrative embodiments, it should be apparent to those skilled in the art that the embodiment can be modified in arrangement and detail without departing from such principles. Many of the software aspects of the embodiment may be implemented in hardware and many of the hardware aspects may be implemented in software. The various components may be combined into fewer components or are divided into more. In view of the many possible embodiments to which the principles of the invention may be applied, it should be understood that the illustrative embodiment is intended to teach these principles and is not intended to limit the scope of the invention. We therefore claim as our invention all that comes within the scope and spirit of the following claims and their equivalents.

We claim:

1. A method for testing a digital circuit that includes combinational logic and a scan chain of memory elements comprising:

clocking a test pattern into the memory elements of the scan chain at a shift frequency;

clocking the digital circuit including the memory elements of the scan chain at an operating frequency of the digital circuit, the operating frequency being different from the shift frequency, the shift frequency being derived from the operating frequency;

launching the test pattern into the combinational logic; and capturing a response to the test pattern in the memory elements of the scan chain while the digital circuit is clocked at the operating frequency, the response being captured in a period of time no greater than one operating-frequency clock cycle from when the test pattern is launched into the combinational logic.

2. The method of claim 1 including clocking the test pattern response out of memory elements of the scan chain at the shift frequency.

3. The method of claim 1 wherein the shift frequency is lower than the operating frequency.

4. The method of claim 1 wherein the shift frequency is provided by selectively suppressing clock pulses that provide the operating frequency.

5. The method of claim 1 wherein the shift frequency is higher than the operating frequency.

6. The method of claim 1 wherein the shift frequency is provided by multiplexing clock pulses that provide the operating frequency with clock pulses that provide a higher frequency than the operating frequency.

7. The method of claim 1 including:

after the test pattern is stored within the scan chain, applying a capture state of a scan enable signal to the memory elements of the scan chain; and before clocking the digital circuit at its operating frequency, suppressing one or more clock pulses that provide the operating frequency until the capture state of the scan enable signal has reached the memory elements.

8. A computer-readable medium on which is stored a computer program having instructions for executing a method for testing a digital circuit that includes combinational logic and a scan chain of memory elements, the method comprising:

clocking a test pattern into the memory elements of the scan chain at a shift frequency;

clocking the digital circuit including the memory elements of the scan chain at an operating frequency of the digital circuit, the operating frequency being different from the shift frequency, the shift frequency being derived from the operating frequency;

launching the test pattern into the combinational logic; and capturing a response to the test pattern in the memory elements of the scan chain while the digital circuit is clocked at the operating frequency, the response being captured in a period of time no greater than one operating-frequency clock cycle from when the test pattern is launched into the combinational logic.

9. A method for testing a digital circuit that includes combinational logic interconnecting at least two interactive clock domains clocked at respective operating frequencies, each domain including a scan chain of memory elements, comprising:

providing a test pattern in the memory elements of a scan chain in the first clock domain;

clocking each clock domain at the domain's respective operating frequency, thereby launching the test pattern into the combinational logic; and at a first time, capturing a response to the test pattern in the memory elements of a scan chain in one clock domain but not the other clock domain, wherein the one clock domain is clocked at its respective operating frequency.

10. The method of claim 9 including, at a second time different from the first, capturing a response to the test pattern in the memory elements of a scan chain in the other clock domain.

11. The method of claim 10 wherein the first and second times correspond to clock pulses occurring at different times.

12. The method of claim 9 wherein the other clock domain is prevented from capturing a test pattern response by suppressing one or more clock pulses of the other clock domain.

13. The method of claim 9 wherein a test pattern is clocked simultaneously into the memory elements of a scan chain in each clock domain at a same shift frequency.

14. The method of claim 9 wherein the operating frequencies of the clock domains are the same frequency.

15. The method of claim 9 including:

applying a capture state of a scan enable signal to the memory elements of the scan chain in the second domain; and suppressing one or more clock pulses that provide the operating frequency for the first domain until the capture state of the scan enable signal has reached the memory elements of the scan chain in the second clock domain.

16. The method of claim 9 wherein the test pattern response is captured within one clock cycle, the clock cycle being of the clock domain that provides the fastest operating frequency.

17. A method for testing a digital circuit that includes combinational logic coupling a first clock domain with a second clock domain, each clock domain associated with a scan chain of memory elements, the method comprising:

providing a test pattern in the memory elements of the scan chain of the first clock domain, the first clock domain having an operating frequency slower than the operating frequency of the second clock domain;

launching the test pattern into the combinational logic;

applying a capture state of a scan enable signal to the memory elements of the scan chain of the second clock domain;

suppressing one or more clock pulses that provide an operating frequency for the second clock domain until the capture state of the scan enable signal has reached the memory elements of the scan chain of the second clock domain;

clocking the second clock domain at its operating frequency; and capturing a response of the combinational logic to the test pattern in the memory elements of the scan chain of the second clock domain while the second clock domain is clocked at its respective operating frequency.

18. The method of claim 17, including, clocking a second time the second clock domain at the operating frequency of the second clock domain;

capturing a second time a response to the test pattern within one clock cycle after the first capture.

19. A method for at-speed testing a digital circuit that includes combinational logic interconnecting at least two clock domains, each domain including a scan chain of memory elements, comprising:

providing a test pattern in the memory elements of a scan chain in the first clock domain, the first clock domain having an operating frequency slower than the operating frequency in the second clock domain;

clocking each clock domain at the domain's respective operating frequency and thereby launching the test pattern into the combinational logic; and capturing a response to the test pattern in the memory elements of a scan chain in the second clock domain within one second-clock-domain clock cycle after the test pattern is launched and while the second clock domain is clocked at the second clock domain's respective operating frequency.

20. A method for at-speed testing a digital circuit that includes combinational logic interconnecting two or more interactive clock domains, each clock domain including a scan chain of memory elements, the method comprising:

clocking a test pattern into the memory elements of at least one scan chain at a common shift frequency applied to the clock domains;

clocking each of the clock domains at the domain's respective operating frequency, at least two of the respective operating frequencies being different, thereby launching the test pattern into the combinational logic; and as a first clock domain is being clocked at its respective operating frequency, capturing a response of the combinational logic to the test pattern in the memory elements of at least one scan chain in the first clock domain, the response being captured in a period of time no greater than one clock cycle from the when the test pattern is launched, the clock cycle being of the clock that provides the operating frequency to the first clock domain.

21. The method of claim 20 including clocking the response out of the memory elements of at least one scan chain at the common shift frequency applied to the two or more clock domains.

22. The method of claim 20 further including suppressing one or more of clock pulses that provide the operating frequencies of the two or more clock domains so that no memory elements of one clock domain capture the response to the test pattern at the same time as memory elements of another clock domain.

23. The method of claim 20 including:

applying a capture state of a scan enable signal to the memory elements of the at least one scan chain in the first clock domain; and suppressing one or more clock pulses that provide the operating frequency to the first clock domain until the capture state of the scan enable signal has reached all the memory elements of the first clock domain.

* * * * *

UNITED STATES PATENT AND TRADEMARK OFFICE
CERTIFICATE OF CORRECTION

PATENT NO. : 6,966,021 B2
APPLICATION NO. : 10/301127
DATED : November 15, 2005
INVENTOR(S) : Rajski et al.

It is certified that error appears in the above-identified patent and that said Letters Patent is hereby corrected as shown below:

<u>In Drawings:</u>
Delete sheets 4 & 7, and substitute the attached sheets 4 & 7 therefor.

<u>In the Specification:</u>
Column 4, line 21 "provides" should read --provide--
Column 6, line 35 "patters" should read --patterns--
Column 8, line 5 "that" should read --than--
Column 8, line 9 "that" should read --than--
Column 9, line 38 "56" should read --54--
Column 9, line 39 "Pll_clk1" should read --Pll_Clk1--
Column 9, line 55 "cycle where. The" should read --cycle. The--
Column 10, line 56 "11110001100" should read --111100001100--
Column 10, line 65 "are divided into more" should read --or divided into more--

Signed and Sealed this

Third Day of February, 2009

JOHN DOLL
*Acting Director of the United States Patent and Trademark Office*

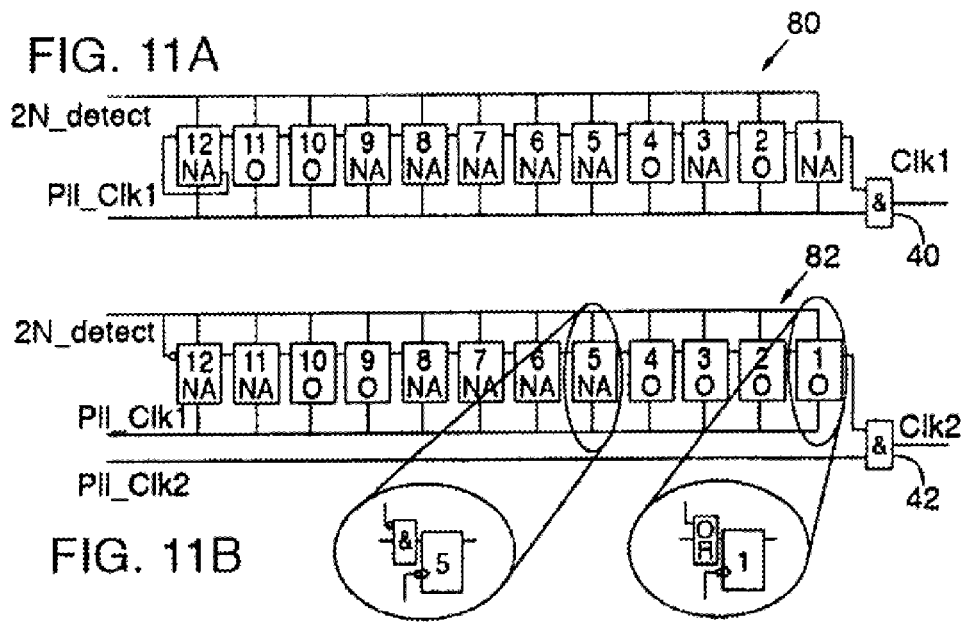
FIG. 11A
FIG. 11B
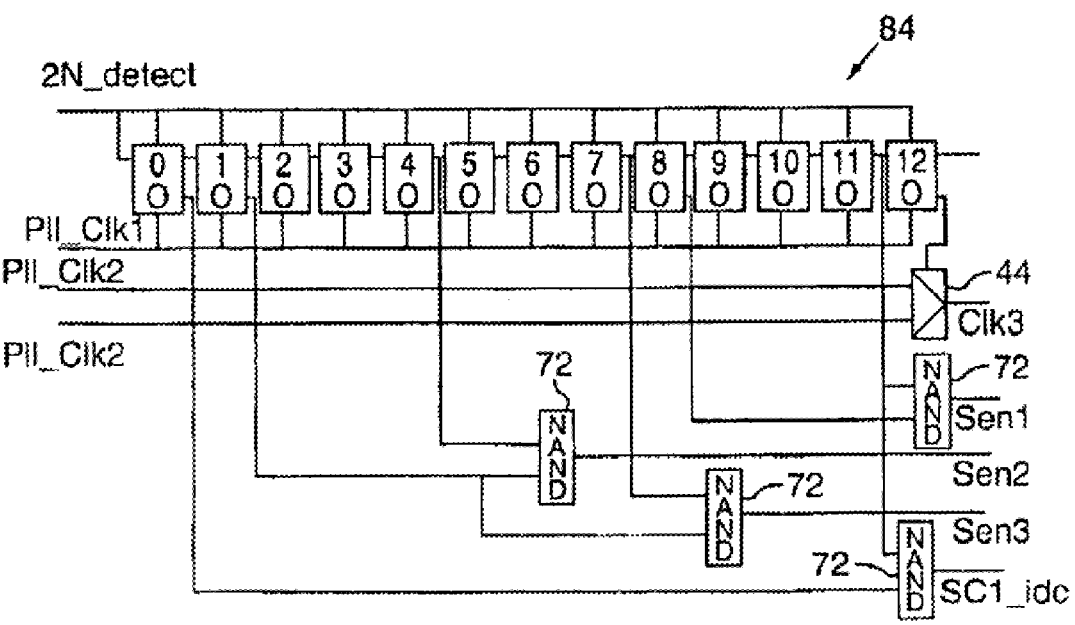
FIG. 12